United States Patent [19]

Johannes

[11] Patent Number: 4,598,894
[45] Date of Patent: Jul. 8, 1986

[54] FASTENING SYSTEM FOR FASTENING A DEVICE WHICH HAS TWO SPACED HOLDING FLANGES

[75] Inventor: Haftmann Johannes, Delbrück-Ostenland, Fed. Rep. of Germany

[73] Assignee: Nixdorf Computer AG, Paperborn, Fed. Rep. of Germany

[21] Appl. No.: 652,360

[22] Filed: Sep. 19, 1984

[30] Foreign Application Priority Data

Sep. 19, 1983 [DE]   Fed. Rep. of Germany ... 8326902[U]

[51] Int. Cl.⁴ ............................................. F16M 13/00
[52] U.S. Cl. ...................... 248/615; 248/632; 248/638; 248/675; 248/220.2; 403/220; 310/51; 417/363
[58] Field of Search .............. 248/603, 604, 609, 614, 248/615, 632–634, 674, 675, 27.1, 201, 220.2, 638; 24/45 B; 403/220, 406; 310/51; 417/363

[56] References Cited

U.S. PATENT DOCUMENTS

| 2,442,754 | 6/1948 | Beam | 248/27.1 |
| 2,654,131 | 10/1953 | Paupitch | 24/458 |
| 2,849,201 | 8/1958 | Schelgunov | 248/615 |
| 2,936,140 | 5/1960 | Copeland | 310/51 |
| 3,155,771 | 11/1964 | Steger | 248/615 |
| 3,274,450 | 9/1966 | Siebold | 248/615 |
| 3,584,469 | 6/1971 | Butts | 310/51 |
| 3,698,833 | 10/1972 | Cann | 417/363 |
| 4,076,197 | 2/1978 | Dochterman | 417/363 |

FOREIGN PATENT DOCUMENTS

| 2913222 | 10/1980 | Fed. Rep. of Germany | 403/406 |
| 2370882 | 7/1978 | France | 403/406 |
| 852546 | 10/1960 | United Kingdom | 248/632 |

Primary Examiner—J. Franklin Foss
Assistant Examiner—Robert A. Olson
Attorney, Agent, or Firm—Krass and Young

[57] ABSTRACT

An elastomeric, sound and vibration damping fastener element (16) for fan motors and the like, adapted to fit between two spaced, parallel mounting flanges or plates (4,6) and comprising a brace body (18) extending between the flanges and connected thereto by buttons (20) which extend into holes in the flanges, a strip (28) which overlies the peripheral edges of the flanges at a corner, and one or more radial arms (24,26) which connect the brace to the strip.

9 Claims, 6 Drawing Figures

FASTENING SYSTEM FOR FASTENING A DEVICE WHICH HAS TWO SPACED HOLDING FLANGES

The invention relates to a fastening system including an elastomeric fastening element which fits between two spaced, parallel plates or flanges and serves to hold such plates or flanges to another device.

Typical examples of units equipped with two supporting flanges include axial blowers such as are built into the instrument case of electrical or electronic apparatus as cooling blowers. These axial blowers generally have an approximately tubular blower body in which the fan root is arranged with the fan wheel by way of spoke-like fastening braces. The two supporting flanges are respectively arranged on the sides of the blower body transversely to the blower shaft.

Such axial blowers or other units of this type are usually fastened with bolts to another structure for example, a wall of the case of a device, where the bolts grip through bores formed in the supporting flanges. This causes noises, especially those generated by the unit itself to be transmitted as a vibration to other parts of the device This often results in an amplification of the sound due to resonance effects or due to a large area noise radiation. In the case of the blowers described, this appears as a disturbing humming.

The principle is already known of connecting such units to the device with so-called rubber/metal connections. However, the use of these rubber/metal connections involve two disadvantages. First the mounting expense is substantially greater than that of direct fastening, and secondly, the space required is increased by the thickness of the rubber/metal connections arranged between the unit and the member receiving these connections.

A special type of fastening means used for blowers connsists in clamping the blower under a metal strip projecting out of the case wall where vibration-damping material, for example slabs of foam rubber, is placed between this strip and the blower in order to avoid any resonance transmission. This solution too requires a considerable mounting and dismounting expense, so that generally when a defective blower is replaced, the whole member carrying the blower must be dismounted.

It is the purpose of the present invention to create a fastening system which makes possible a simple, space-saving fastening for units of this class and which ensures an effective vibration damping between the unit and the device receiving it.

The fastening element of this fastening system grips with the retaining brace between the supporting flanges, so that the required mounting space in the axial direction is not enlarged beyond the depth of the unit. By means of one or more connecting arms the retaining brace is connected with a main strip or the like, on the face of which turned toward the receiving member are arranged locking means by means of which it is fastened to this member. The connecting arms or the main strip or both consist of an elastic material, so that the vibrations and noises generated by the unit cannot be transmitted to the device. The elastic material used may, for example, be a polyurethane elastomer.

In the preferred embodiment of the invention the main strip exhibits a depth bridging the spacing between the two supporting flanges in such a way that during the mounting of the fastening element the main strip is placed on the outer edges, preferably at corners, of the two supporting flanges. By reason of the elasticity of the connecting arms and/or of the main strip this results in a suitable alignment and locking-in of the fastening element with respect to the supporting flanges.

A particularly simple connection between the fastening element and the supporting flanges results when extensions, which engage openings formed on the supporting flanges are formed on the ends of the retaining brace. The mounting of the fastening elements can be done either during the assembling of the unit or in such a way that the retaining brace is simply pushed between the supporting flanges, whereby the latter elastically yield and/or, as will be described further below, the retaining brace itself is compressible in the axial direction.

In the preferred embodiment of the invention, the whole fastening element is made in one piece of an elastic plastic material.

The supporting flanges are generally constructed in polygonal shape, rectangular in particular. It is thus provided according to the invention that the main strip takes the shape of a two-sided angle with a cross sectional shape corresponding to the shape of the respective flange corners assigned to it. The main strip then closely fits the flange corners on the outside, so that the result is an exact alignment and locking in of the fastening elements on the supporting flanges. In the embodiment described it is provided that each side of the strip is respectively connected with the retaining brace by means of a connecting arm. Where the unit uses the preferred rectangularly shaped supporting flange with rounded corners, the sides of the main strip are arranged perpendicularly to each other and are connected by an arc with approximately the shape of a quarter circle.

The locking means formed on the strip may be of any desired shape which will permit fastening onto the device receiving the unit. In one embodiment of the invention it is provided that a lock catch rising somewhat like a ramp is arranged on the outside of at least one side of the main strip. This embodiment is particularly suited for locking the unit in position between two elastic strips standing up perpendicularly on one wall of the case of the device, as will be described more accurately below. In another embodiment of the invention at least one lock knob or the like is arranged on the main strip which knob can engage directly a bore in the wall of the case. This embodiment is preferably used for the so-called "horizontal mounting", in which the supporting flanges are arranged approximately parallel to a wall of the case. For this, the stop knob is aligned transversely to the alignment of the sides of the main strip, as will also be described more accurately below.

A number of illustrative embodiments of the invention are represented in the drawing and described in more detail in the following.

DETAILED DESCRIPTION OF THE ILLUSTRATIVE EMBODIMENTS

Figure 1:
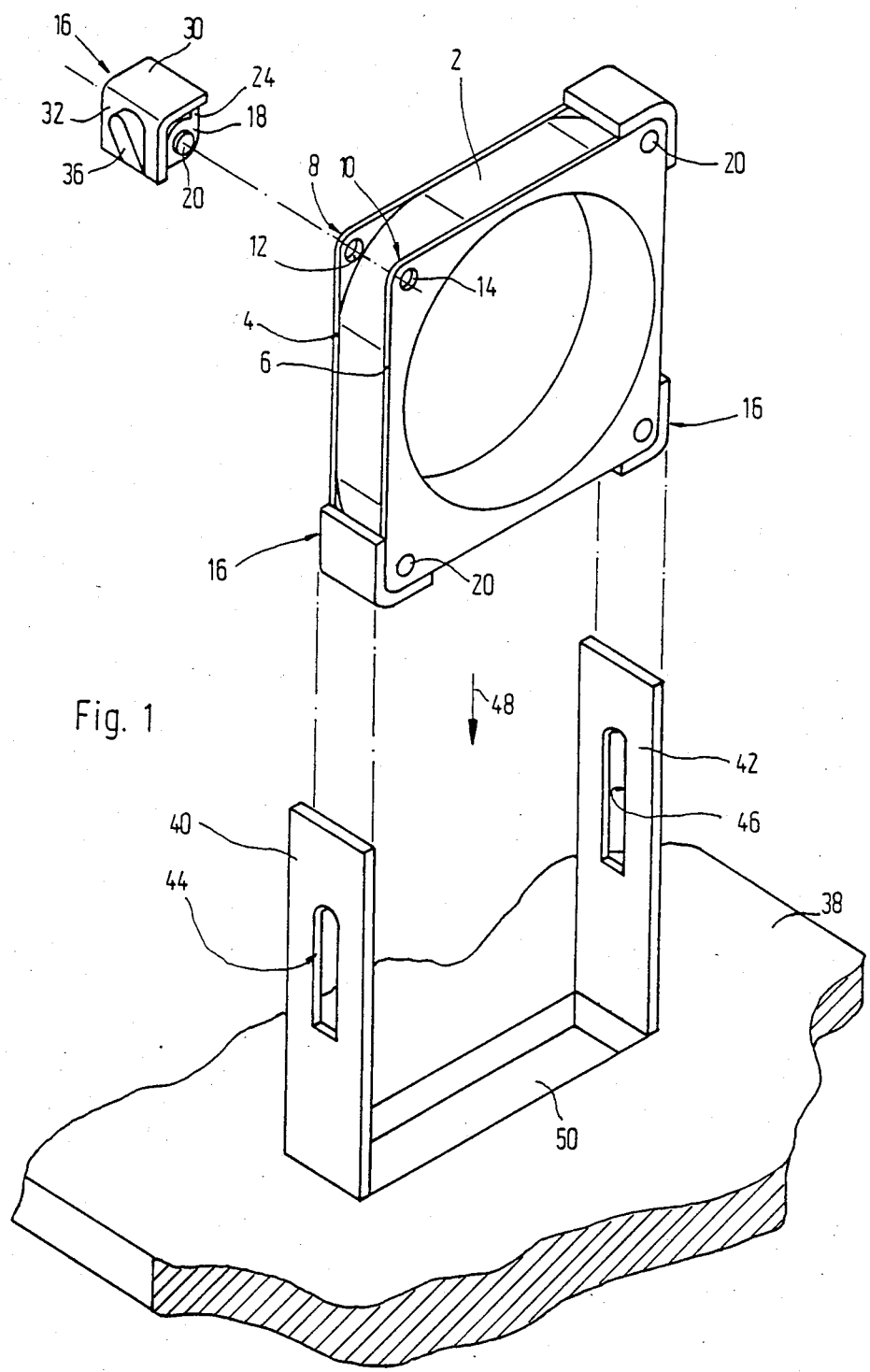
FIG. 1 shows a perspective representation of a fastening element, a unit to be fastened and a device for receiving this unit.

FIG. 1 shows an approximately tubular body 2 of an axial blower with supporting flanges 4 and 6 arranged in parallel on both end sides of the body 2. The body 2 is of conventional construction. For ease of viewing, the individual unit arranged in this body 2 and consisting of a fan root with drive and a fan wheel is omitted, all of these being conventional. As can be seen, the two supporting flanges 4,6 project over the outer periphery of the body 2 in the region of their edges, e.g. 8 and 10. Openings 12,14 are provided respectively in the region of the flange corners.

Figure 2:
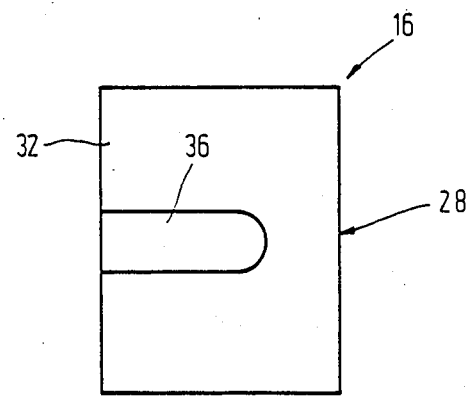
FIG. 2 is a side view of the fastening element of FIG. 1.
Figure 3:
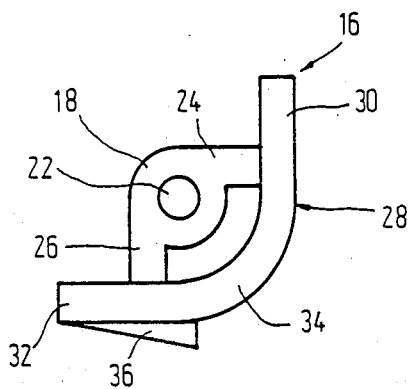
FIG. 3 is an end view of the element of FIG. 1.
Figure 4:
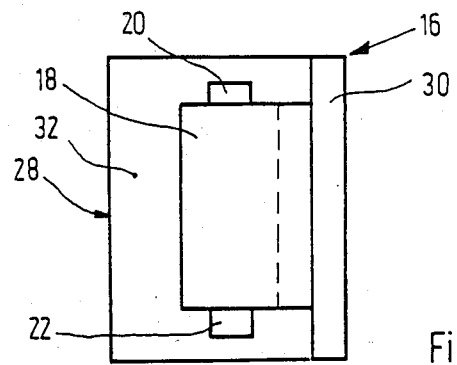
FIG. 4 is a bottom view of the element of FIG. 1.

As FIGS. 2 to 4 in particular show, the fastening element 16 consists essentially of a retaining brace 18 the length of which corresponds to the inner spacing between the supporting flanges 4,6. On the faces of the retaining brace 18 are, respectively, extension buttons 20,22 which are intended to engage in the openings 12,14. A main strip 28 is connected with the retaining brace 18 by means of two connecting arms 24,26. The main strip 28 has the shape of a two-sided angle, the sides 30,32 of which are perpendicular to each other and are connected with each other by an arc 34 with about a quarter circle shape. The width of the main strip 28 is chosen such that it lies against the outer peripheral edges of the supporting flanges 4,6, as can be seen particularly in FIG. 1. The main strip 28 is shaped so that it fits exactly on and conforms to the corners of the supporting flanges.

On the side 32 of the main strip 28 is arranged a lock catch 36 rising out in the manner of a ramp from the free end of this side in the directon of the arc 34 connecting the sides. On one wall 38 of the case of the receiving device are arranged two retaining strips standing up approximately perpendicularly to the wall. Openings 44,46 like slots are made in the retaining strips 40,42 respectively. In the embodiment represented in FIG. 1, the two upper fastening elements 16 are respectively aligned so that the lock catches 36 are located respectively on the lateral sides coming in contact with the retaining strips 40,42. The two lower fastening elements 16, however, are oriented so that the lock catches 36 point downward in the mounting direction 48, and so are not to be seen in this representation.

In operation, the body 2 and flanges 4 and 6, equipped with at least one fastening element 16 are pushed in the direction of the arrow 48 between the retaining strips 40,42, these retaining strips being forced away from each other by the lock catches 36 until these catch in the openings 44,46 so that the body 2 is locked in position in the direction opposite the arrow 48. An opening 50 can be formed in the wall 38 of the case of the receiving device between the retaining strips 40,42 which opening receives the underside of the body 2 and serves for an additional locking in position.

The fastening elements 16 are preferably made in one piece out of an elastomeric material. For the mounting, the retaining brace 18 can be compressed far enough so that the extension buttons 20,22 can be pushed between the supporting flanges 4,6 until they catch elastically in the openings 12,14. Since the main strip 28 likewise consists of elastic material, fastening element 16 transmits no vibrations to the wall 38 even when the unit lies directly on this wall.

Figure 5:
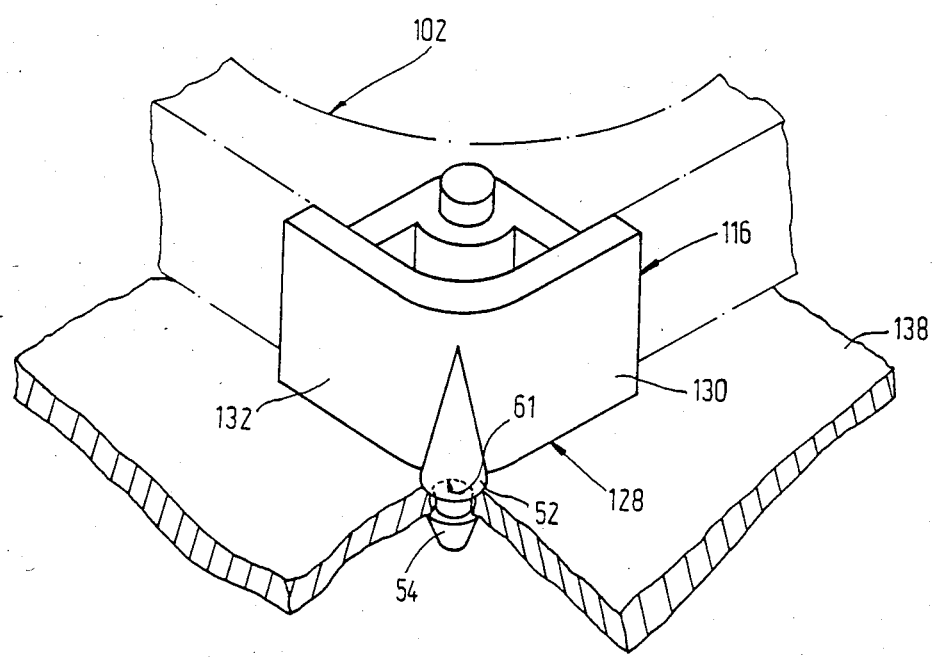
FIG. 5 is a perspective view of an embodiment of a fastening element for the horizontal fastening of a unit.

FIG. 5 shows a fastening element 116 which in its essential parts corresponds to the fastening element 16 and therefore need not be described again in detail. On a bulge 52 of material formed out on the outside of the main strip 128 is formed a lock knob 54 arranged transversely to the longitudinal axis of the main strip and parallel to the axis of the blower, which knob can engage in known manner with elastic deformation in a bore made in the wall 138 of the case. This arrangement is particularly suitable for the horizontal fastening of the unit. In order for the body 102 not to come in direct contact with the wall 138, either the main strip 128 may be somewhat wider than the body 102 or else the bulge 52 of material is drawn out somewhat over the side edges of the main strip 128.

Figure 6:
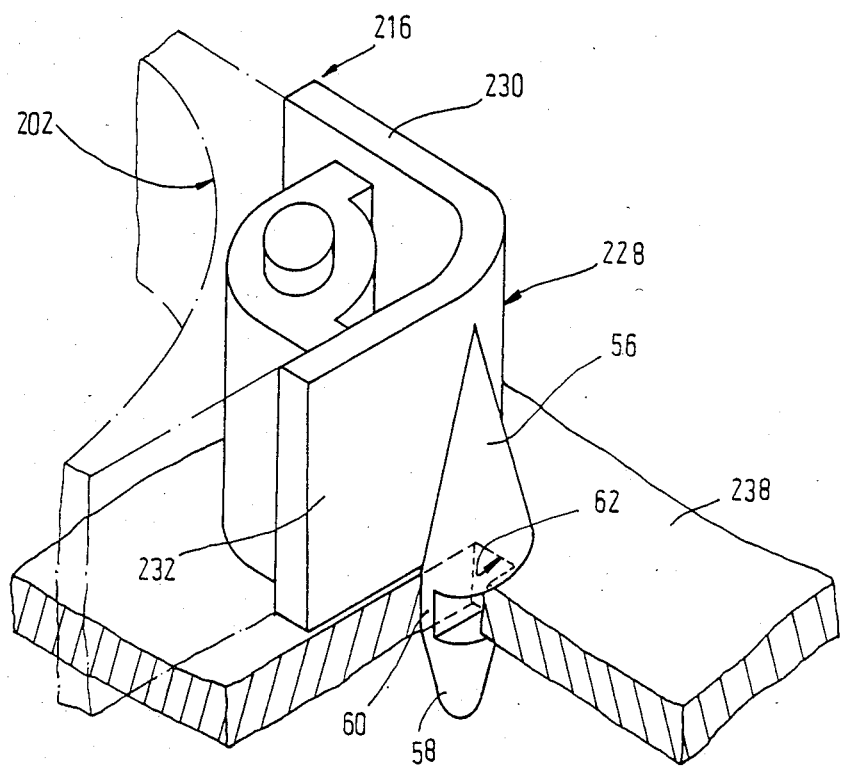
FIG. 6 is a perspective view of another embodiment of a fastening element the horizontal fastening of a unit.

FIG. 6 shows a fastening element 216 which substantially corresponds to the fastening element 116 represented in FIG. 5. It differs from the latter essentially in that a lock knob 58 is fastened onto the bulge 56 of material by way of an elastically bendable arm 60. For mounting the unit equipped with the fastening elements 216, the lock knobs 58 are inserted in a known manner into their assigned openings in the case wall 238 which are slightly offset with respect to these knobs, so that the lock knobs 58 are elastically forced to the side until they have passed along the case wall 238 and elastically lock in their openings. This embodiment permits a simple dismounting of the unit, in which the lock knobs 58 are elastically forced to the side until they can come out of the openings 62 in the wall of the case.

I claim:

1. A system providing means to secure a body to a receiving member, comprising, in combination:
   a body having a depth D;
   a pair of flat, rigid plates shaped to conform generally to said body and fixed abuttingly on opposite plane faces of said body, each plate having at least one corner section extending beyond an edge of said body in corresponding opposition to said corner section of the other plate of said pair, each corner section having an opening in corresponding opposition to said opening of said corner section of said other plate;
   a fastening element comprising:
      a main strip of depth D' equal to depth D of said body plus the combined thickness of both of said pair of plates, with a biplanar configuration shaped to correspond to an associated corner section of said pair of plates;
      a retaining brace, disposed within the included angle of said biplanar-configured main strip, having opposite faces and a dimension between said faces substantially equal to depth D of said body, and having on each face a button disposed to fit within said openings of said corner sections upon association of said fastening element with said corner sections; and locking means disposed on an outside surface of said main strip; and
   a receiving member to secure the body to.

2. The system of claim 1 wherein the main strip of said fastening element consists of an elastomeric material.

3. The system of claim 1 wherein said fastening element is formed as a single, integral unit.

4. The system of claim 3 wherein said fastening element is formed of an elastic, plastic material.

5. The system of claim 1 wherein the retaining brace is connected to the main strip by at least one connecting arm.

6. The system of claim 5 wherein said connecting arm is formed of an elastomeric material.

7. The system of claim 1 wherein the locking means comprises a lock catch having a ramp-type structure with the low end of said ramp structure disposed to contact a receiving member before the high end of said ramp structure when the body, plate, and fastening element combination is initially positioned to operatively engage the receiving member, and wherein the receiving member comprises at least one retaining strip having an opening disposed to securely engage said lock catch.

8. The system of claim 7 wherein said retaining strip is formed of semi-rigid material having sufficient flex to allow elastic displacement of said retaining strip when the high end of said ramp-type lock catch is adjacent said retaining strip and before engaging said opening in the retaining strip.

9. The system of claim 1 wherein the locking means comprises a bulge of material disposed on the outer surface of said main strip from which extends, beyond an edge of said main strip, a flexible lock knob and wherein the receiving member has an opening disposed to securely engage said lock knob.

* * * * *